(12) United States Patent
Maier

(10) Patent No.: US 7,064,448 B2
(45) Date of Patent: Jun. 20, 2006

(54) POWER CONTROLLER WITH BOND WIRE FUSE

(75) Inventor: Josef Maier, Munningen (DE)

(73) Assignee: Hamilton Sundstrand Corporation, Rockford, IL (US)

( * ) Notice: Subject to any disclaimer, the term of this patent is extended or adjusted under 35 U.S.C. 154(b) by 14 days.

(21) Appl. No.: 10/931,950

(22) Filed: Sep. 1, 2004

(65) Prior Publication Data

US 2006/0043610 A1    Mar. 2, 2006

(51) Int. Cl.
*H01L 23/48*    (2006.01)
*H01L 23/52*    (2006.01)

(52) U.S. Cl. .................. 257/784; 257/341; 257/529

(58) Field of Classification Search ................ None
See application file for complete search history.

(56) References Cited

U.S. PATENT DOCUMENTS

2003/0095367 A1*   5/2003   Mares et al. ............... 361/93.7
2003/0132732 A1*   7/2003   Thomas et al. ............. 320/134

* cited by examiner

*Primary Examiner*—Tu-Tu Ho
(74) *Attorney, Agent, or Firm*—Carlson, Gaskey & Olds

(57) ABSTRACT

A power controller includes bond wires that also act as fuses to protect the power controller from damage caused by a short circuit fault. The bond wires connect switching elements within the power controller with at least one output pin having at least one output rating. The bond wires themselves are configured so that the steady state current capability of each bond wire matches the output rating of its corresponding output pin. The power controller measures an output current to a load and adapts its protection functions depending on its programmed output rating. The output rating of the power controller may be controlled by the output rating of a particular pin or the number of switching elements that are turned on within the power controller.

17 Claims, 2 Drawing Sheets

POWER CONTROLLER WITH BOND WIRE FUSE

TECHNICAL FIELD

The present invention relates to power controllers, and more particularly to protection mechanism to prevent damage to wires protected by a power controller.

BACKGROUND OF THE INVENTION

Power controllers, such as solid state power controllers (SSPCs) are used in many applications as overcurrent protection circuits. For example, power controllers may be used to protect an AC wire harness against damage if the power controller experiences a short circuit failure caused by overcurrent or short circuiting at a load. A short circuit failure in the power controller, however, may also damage components in the power controller itself due to high currents entering the power controller.

Although fuses or similar devices may be incorporated into a given system application to protect a wire associated with a failed power controller, this adds complexity and cost to the system.

There is a desire for a system that allows a power controller to be used for overcurrent protection without resulting in damage to the wire in case of a failed shorted power controller.

SUMMARY OF THE INVENTION

The invention provides backup protection in addition to protection provided by a power control to protect a wire from damage caused by a short circuit fault by using bond wires within the power controller as fuses. The bond wires connect switching elements within the power controller to at least one output pin having at least one corresponding output rating. The bond wires themselves are configured so that the steady state current capability of each bond wire matches the output rating of its corresponding output pin. The power controller measures an output current to a load and adapts its protection functions depending on its programmed output rating.

In one embodiment, each output pin has a different rating, and the number of bond wires connected to a given output pin is based on the output rating of that particular output pin. The output pins are connected to each other such that all of the switching elements in the power controller can be switched on at the same time, regardless of which output rating has been chosen by the power controller.

DETAILED DESCRIPTION OF THE PREFERRED EMBODIMENT

Figure 1:
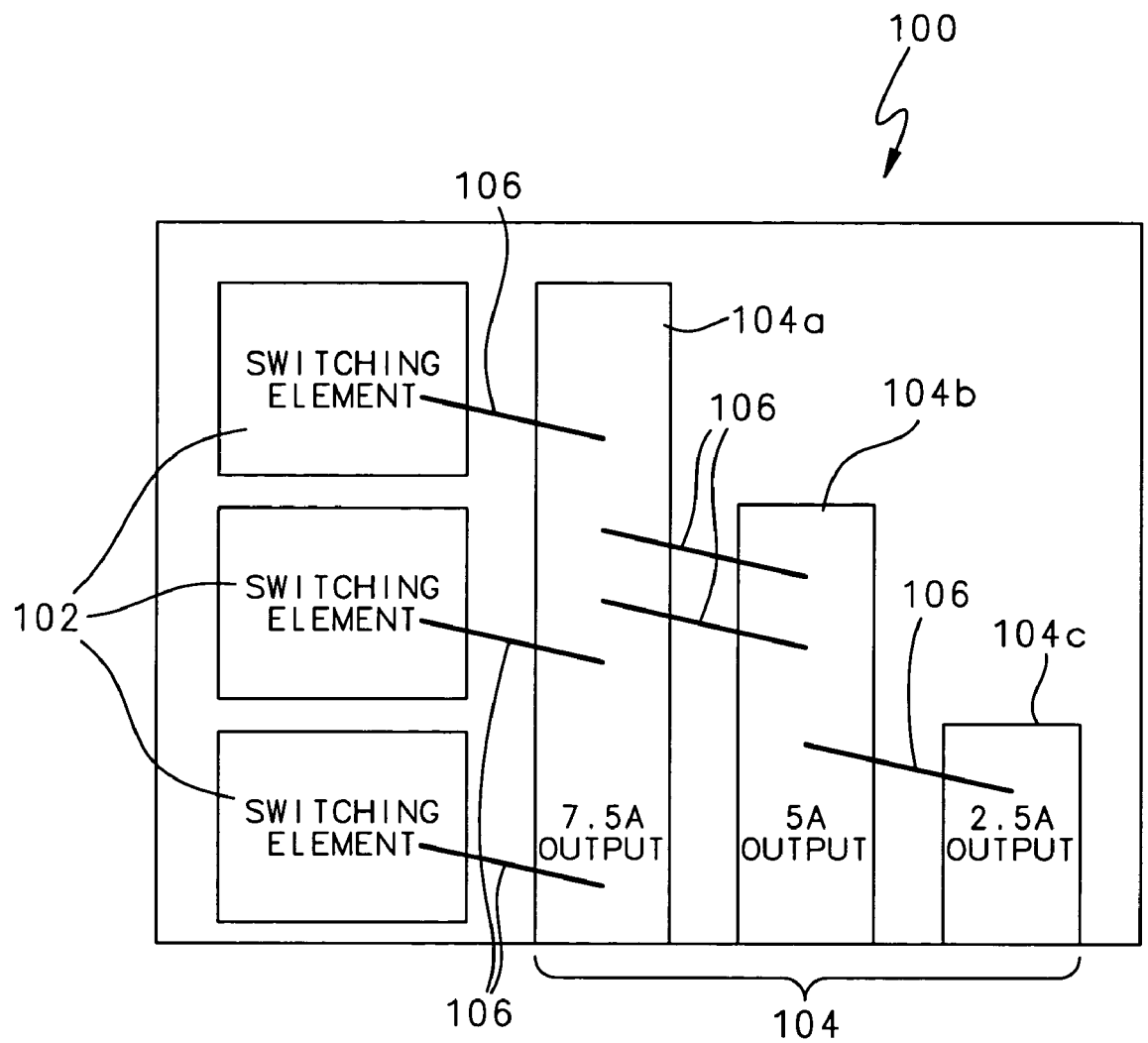
FIG. 1 is a representative diagram of a power controller according to one embodiment of the invention.
Figure 2:
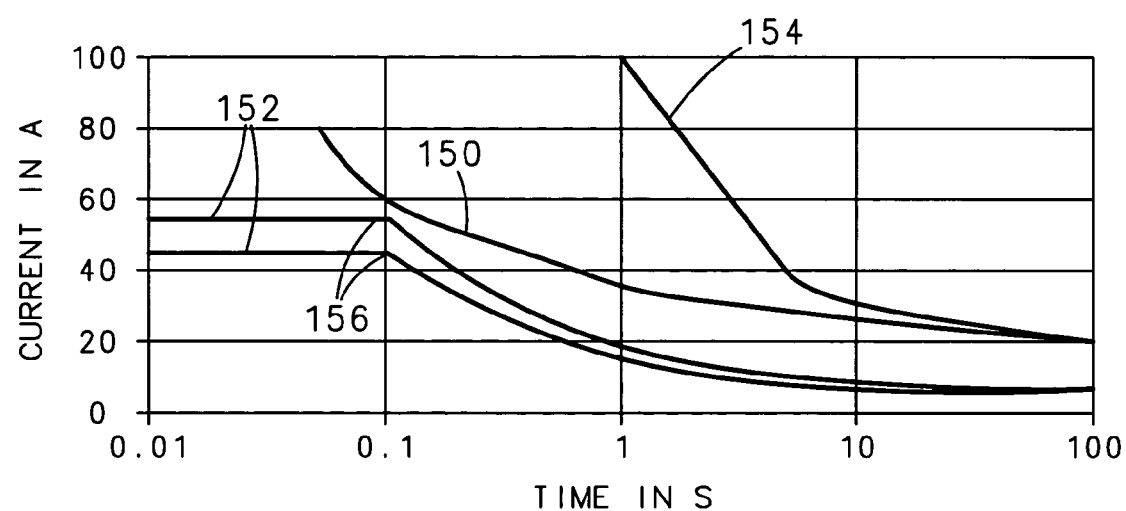
FIG. 2 is an example of a graph illustrating characteristics of a bond wire compared with overcurrent protection characteristics in a power controller according to one embodiment of the invention.

FIG. 1 is a representative diagram of a power controller 100 according to one embodiment of the invention. In this embodiment, the power controller 100 has a plurality of switching elements 102 and a plurality of output pins 104. The output pins 104 are connected to the switching elements 102 via one or more bond wires 106. The switching elements 102 themselves can be any appropriate switching devices, such as MOSFETs, IGBTs, thyristors, etc., and may be in the form of silicon chips.

In the embodiment shown in FIG. 1, the output pins 104 are each programmed to have a different output rating. Typically, each output pin 104 has an output rating that is a multiple of a base current value I. In the illustrated example, the output pins 104 have output ratings of 2.5 A, 5.0 A, and 7.5 A. Thus, the power controller 100 can be programmed to conduct one or more protection functions when an steady-state output current to a load reaches 2.5 A, 5.0 A, or 7.5 A, respectively. By providing output pins 104 having different ratings, the power controller 100 can be programmed so that its internal electronic circuits and/or software will activate the protection functions (e.g., overcurrent turn-off threshold, time-overcurrent protection characteristic, etc.) of the power controller 100 at different output current levels to the load. Of course, other output ratings are possible without departing from the scope of the invention.

The embodiment shown in FIG. 1 connects each output pin 104 only with the number of bond wires 106 needed to achieve the corresponding output rating for that output pin 104. In the example shown in FIG. 1, all of the switching elements 102 are connected to a first output pin 104a having the highest output rating. The switching elements 102 and the output pin 104a are connected together by a plurality of bond wires 106. In this example, each bond wire 106 carries an amount of current equal to the base current value I when its corresponding switching element 102 is turned on. Thus, the output rating of the output pin 104a directly connected to the switching elements in this example is 3I when all of the switching elements 102 are turned on.

As shown in FIG. 1, the output ratings of the other output pins 104 may be controlled by selecting the number of bond wires 106 connected to the output pins 104. Each output pin 104 is dedicated to a selected output rating. For example, assuming that all of the switching elements 102 are turned on during operation of the power controller 100, two bond wires 106 connect the output pin having the highest output rating 104a with a second output pin 104b having a lower output rating (e.g., an output rating of 2I as opposed to 3I). Because there are two bond wires connected to the second output pin 104b, a maximum current amount of 2I will reach the second output pin 104b. Similarly, one bond wire 106 links the second output pin 104b and a third output pin 104c having an even lower output rating (e.g., an output rating of I). Thus, a maximum current amount of I will reach the third output pin 104c.

The configuration in FIG. 1 minimizes power dissipation in the power controller 100 by keeping all of the parallel switching elements 102 turned on at all times during controller operation, regardless of which output rating has been chosen. As noted above, each output rating has its own dedicated output pin 104, allowing the output rating to be controlled by connecting the load to the output pin corresponding with the desired output rating.

In the example described above, the bond wires 106 act as fuses to protect the power controller 100. The bond wires 106 may be made of any electrically conductive material (e.g., aluminum, gold, copper, etc.) and are configured so that the steady state capability of each bond wire 106 matches its output rating. For example, if the output rating of a given output pin 104 is 2.5 A, the bond wire 106 is configured so that its steady state current capability is 2.5 A. Thus, if the current in a given bond wire is greater than 2.5

A in this example, the bond wire 106 will break, thereby protecting the other components in the power controller 100 from excessive currents.

The fuse characteristic of a given bond wire 106 is dictated by the melting point of the material used to form the bond wire 106 as will as the temperature increase experienced by the material as it conducts steady state current and during overcurrent conditions. Behavior of a bond wire having a selected geometry and material characteristic can be simulated based on known material characteristics before being implemented. The fuse characteristics of the bond wire 106 are preferably selected so that they correspond with an overcurrent protection trip curve in the power controller 100 (i.e., the current levels at which the power controller 100 activates its internal protection mechanisms). The specific bond wire geometries needed to obtain a desired fuse characteristic are obtainable by those of skill in the art based on known temperature and conduction properties of various materials. For example, bond wires 106 that are arranged in parallel may each have a shorter length than a single bond wire designed to conduct the same amount of current as the paralleled bond wires 106, assuming the same wire diameter.

FIG. 3 illustrates one example of the fuse characteristics of a bond wire 106 link associated with an output rating of 5.0 A for illustrative purposes only. Those of skill in the art will understand that this example is not intended to limit the scope of the invention in any way. This example illustrates a bond wire fuse characteristic 150 compared with a wire damage curve 152 and an overcurrent protection trip curve 154. As shown in FIG. 3, the wire damage curve shows that wire damage may occur if high current levels are sustained for an extended period of time, eventually reducing current flow at a break point 156 and then stopping current flow altogether due to wire breakage. Note that the break point 156 will occur at a higher current level if the output rating is higher and will occur at a lower current level if the output rating is lower. The overcurrent protection trip curve 154 is selected to protect the power controller 100 from damage at steady state currents that are well above its selected output rating. However, failure of the overcurrent protection in the power controller 100 may still allow potentially damaging high currents to flow through the power controller 100.

The fuse characteristic of the bond wire 106 is selected so that it reduces the current flow through the power controller 100 at high current levels, thereby reducing or eliminating wire damage even if the overcurrent trip protection fails. The bond wires 106 therefore act as a secondary protection mechanism within the power controller 100 to protect the power controller 100 and its associated wires.

The invention therefore provides additional current protection for a power controller by configuring the internal bond wires within the controller as fuses. Selecting the bond wire geometry so that its steady state current capability matches the output rating of its associated output pin, either alone or in combination with other bond wires, provides a simple way to incorporate additional protection for the controller without adding to its cost or complexity.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A power controller, comprising:
  a switching element;
  a plurality of output pins corresponding to the switching element, wherein each of the plurality of output pins corresponds to a different output rating; and
  a plurality of bond wires connecting the switching element to at least one of the output pins, wherein the plurality of bond wires have a fuse characteristic corresponding to at least one of the output ratings.

2. The power controller of claim 1, wherein the switching element comprises a plurality of switching elements.

3. The power controller of claim 2, wherein each bond wire is associated with one of said plurality of switching elements and connected to at least one output pin.

4. The power controller of claim 1, wherein said plurality of output pins comprises a first output pin having a first output rating, a second output pin having a second, different output rating, and a third output pin having a third, different output rating.

5. A power controller comprising:
  a switching element including a plurality of switching elements;
  an output pin corresponding to at least one output rating, the output pin comprising a plurality of output pins that include a first output pin having a first output rating and a second output pin having a second output rating; and
  at least one bond wire connecting the switching element to at least one of the plurality of output pins, wherein said at least one bond wire has a fuse characteristic corresponding to said at least one output rating, said at least one bond wire comprising a plurality of bond wires, each bond wire associated with one of said plurality of switching elements and connected to output pin, wherein the first output rating and the second output ratings are a multiple of a base value, and wherein said at least one bond wire comprises a plurality of bond wires, the number of said plurality of bond wires corresponding to the multiple.

6. The power controller of claim 5, wherein the output pin comprises a first output pin having a first output rating, a second output pin having a second output rating, and a third output pin having a third output rating, wherein the third output rating is equal to a base value and the first and second output ratings are a multiple of the base value,
  wherein said at least one bond wire comprises a plurality of bond wires connected each switching element to the first output pin, and wherein the power controller further comprises at least one bond wire between the first and second output pins and between the second and third output pins.

7. The power controller of claim 1, wherein the fuse characteristic of the bond wire is controlled by at least one of a material characteristic and a geometry of the bond wire.

8. The power controller of claim 2, wherein the plurality of bond wires includes a first bond wire connecting a first one of the plurality of switching elements and a first one of the plurality of output pins and a second bond wire connecting a second one of the plurality of switching elements and a second one of the plurality of output pins.

9. The power controller of claim 8, wherein the plurality of bond wires includes a pair of bond wires connecting the first output pin and the second output pin.

10. The power controller of claim 9, wherein the plurality of bond wires includes a third bond wire connecting a third one of the plurality of switching elements and a third one of the plurality of output pins.

11. The power controller of claim 10, wherein the plurality of bond wires includes a fourth bond wire connecting the second output pin and the third output pin.

12. The power controller of claim 11, wherein the output rating of the first output pin is greater than the output rating of the second output pin.

13. The power controller of claim 12, wherein the output rating of the second output pin is greater than the output rating of the third output pin.

14. A power controller comprising:
   a first switching element;
   a second switching element;
   a first output pin having a first output rating that is a first multiple of a base value;
   a second output pin having a second output rating that is a second multiple of the base value that is different from the first multiple; and
   bond wires connecting the first switching element and the second switching element to the first output pin and the second output pin, each of said bond wires having a fuse characteristic corresponding to one of the first output rating or the second output rating, and wherein the number of bond wires corresponds to at least one of the first multiple or the second multiple.

15. The power controller of claim 14, wherein the multiple is a whole number.

16. The power controller of claim 14, wherein the number of bond wires that input electric current to the first output pin or the second output pin corresponds to at least one of the first multiple or the second multiple.

17. The power controller of claim 16, wherein the number of bond wires that input electric current to the first output pin or the second output pin is equal to the multiple.

* * * * *